United States Patent
Coumou et al.

(10) Patent No.: US 10,304,669 B1
(45) Date of Patent: May 28, 2019

(54) ADAPTIVE COUNTER MEASURE CONTROL THWARTING IMD JAMMING IMPAIRMENTS FOR RF PLASMA SYSTEMS

(71) Applicant: MKS Instruments, Inc., Andover, MA (US)

(72) Inventors: David J. Coumou, Webster, NY (US); Dennis M. Brown, Pittsford, NY (US); Eldridge M. Mount, IV, Macedon, NY (US)

(73) Assignee: MKS Instruments, Inc., Andover, MA (US)

( * ) Notice: Subject to any disclaimer, the term of this patent is extended or adjusted under 35 U.S.C. 154(b) by 0 days.

(21) Appl. No.: 15/876,189

(22) Filed: Jan. 21, 2018

(51) Int. Cl.
| | |
|---|---|
| H01J 37/32 | (2006.01) |
| H03F 1/30 | (2006.01) |
| H03L 7/085 | (2006.01) |
| H03F 3/19 | (2006.01) |
| H03F 3/21 | (2006.01) |

(52) U.S. Cl.
CPC .... H01J 37/3299 (2013.01); H01J 37/32174 (2013.01); H01J 37/32183 (2013.01); H03F 1/30 (2013.01); *H01J 37/3211* (2013.01); *H01J 37/32091* (2013.01); *H03F 3/19* (2013.01); *H03F 3/21* (2013.01); *H03F 2200/451* (2013.01); *H03L 7/085* (2013.01)

(58) Field of Classification Search
CPC ............. H01J 37/3299; H01J 37/32174; H01J 37/3211; H01J 37/32091; H01J 37/32183; H03F 1/30; H03F 3/21; H03F 3/19; H03F 2200/451; H03L 7/085
See application file for complete search history.

(56) References Cited

U.S. PATENT DOCUMENTS

| | | | |
|---|---|---|---|
| 7,602,127 B2 | 10/2009 | Coumou | |
| 8,110,991 B2 | 2/2012 | Coumou | |
| 8,395,322 B2 | 3/2013 | Coumou | |
| 2005/0110567 A1 | 5/2005 | Rabinovich et al. | |
| 2010/0225389 A1 | 9/2010 | Teetzel | |
| 2011/0248634 A1* | 10/2011 | Heil ................. | H01J 37/32009 315/111.41 |
| 2013/0169359 A1 | 7/2013 | Coumou | |
| 2014/0263199 A1 | 9/2014 | Nelson et al. | |
| 2017/0018926 A1 | 1/2017 | Coumou et al. | |
| 2017/0062186 A1* | 3/2017 | Coumou .......... | H01J 37/32155 |

OTHER PUBLICATIONS

International Search Report and Written Opinion for International Application No. PCT/US2018/067902, dated Apr. 22, 2019.

* cited by examiner

*Primary Examiner* — Jung Kim
(74) *Attorney, Agent, or Firm* — Harness, Dickey & Pierce, P.L.C.

(57) ABSTRACT

An RF generator in a dual frequency RF generation system. The RF generator detects IMD components resulting from interaction of the two frequencies. The IMD is reduced by adjusting the phase of the RF signal output by the RF generator. In various configurations, the IMD may also be reduced by applying a power adjustment value.

35 Claims, 7 Drawing Sheets

ADAPTIVE COUNTER MEASURE CONTROL THWARTING IMD JAMMING IMPAIRMENTS FOR RF PLASMA SYSTEMS

FIELD

The present disclosure relates to plasma systems and to controlling intermodulation distortion (IMD) in systems having multiple power generators driving non-linear loads.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Plasma etching is frequently used in semiconductor fabrication. In plasma etching, ions are accelerated by an electric field to etch exposed surfaces on a substrate. In one basic implementation, the electric field is generated based on RF power signals generated by a radio frequency (RF) generator of a RF power system. The RF power signals generated by the RF generator must be precisely controlled to effectively execute plasma etching.

SUMMARY

A radio frequency (RF) generator includes a power amplifier that generates a first RF signal applied to a non-linear load in accordance with in input control signal. An intermodulation distortion (IMD) module determines the IMD in a signal reflected from the non-linear load, where the IMD is generated in accordance with the interaction between the first RF signal and a second RF signal applied to the non-linear load from a second RF generator. A phase adjustment module receives the IMD determined by the IMD module and determines a phase adjustment. The phase adjustment module generates an adjustment signal to reduce the IMD, the adjustment signal varying a phase of the first RF signal.

An apparatus for reducing IMD includes an intermodulation distortion (IMD) module configured to determine the IMD reflected from a non-linear load in response to a first RF signal and a second RF signal applied to the non-linear load via respective first and second RF generators. The IMD is generated in accordance with interaction between the first RF signal and the second RF signal. A phase adjustment module receives the IMD determined by the IMD module and determines a phase adjustment. The phase adjustment module generates an adjustment signal to reduce the IMD, where the adjustment signal varies a phase of a selected one of the first RF signal or the second RF signal. The adjustment signal is input to a power amplifier of an RF generator generating the selected one of the first RF signal or the second RF signal to vary a phase of the selected one of the first RF signal or the second RF signal output by the selected one of the first RF generator or the second RF generator.

A method for reducing IMD includes determining IMD reflected from a non-linear load in response to a first RF signal and a second RF signal applied to the non-linear load via a respective first RF generator and second RF generator. The IMD is generated in accordance with interaction between the first RF signal and the second RF signal. A phase adjustment is determined and an adjustment signal is generated to reduce the IMD, where the adjustment signal varying a phase of a selected one of the first RF signal or the second RF signal. An adjustment signal is input to a power amplifier of an RF generator generating the selected one of the first RF signal or the second RF signal to vary a phase of the selected one of the first RF signal or the second RF signal output by the selected one of the first RF generator or the second RF generator.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
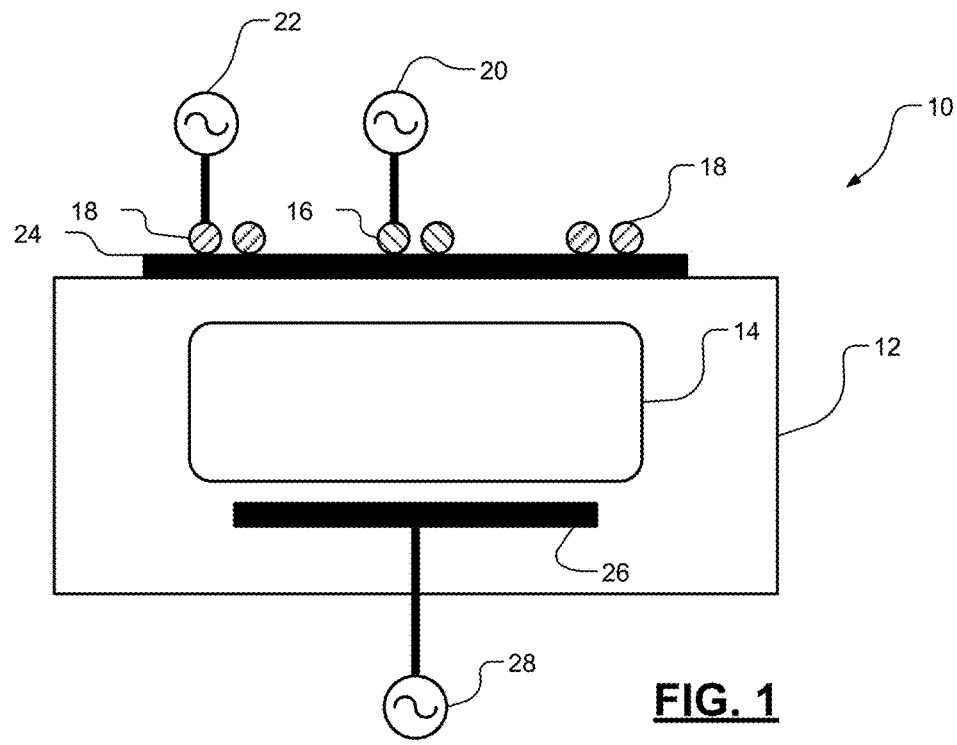
FIG. 1 depicts a representation of an inductively coupled plasma system.

Example embodiments will now be described more fully with reference to the accompanying drawings.

A RF power system may include a RF generator, a matching network, and a load (e.g., a plasma chamber). The RF generator generates a RF power signal, which is received by the matching network. The matching network matches an input impedance of the matching network to a characteristic impedance of a transmission line between the RF generator and the matching network. This impedance matching aids in maximizing an amount of power forwarded to the matching network ("forward power") and minimizing an amount of power reflected back from the matching network to the RF generator ("reverse power"). Forward power may be maximized and reverse power may be minimized when the input impedance of the matching network matches the characteristic impedance of the transmission line.

In the RF power source or supply field, there are typically two approaches to applying the RF signal to the load. A first, more traditional approach is to apply a continuous wave signal to the load. In a continuous wave mode, the continuous wave signal is typically a sinusoidal wave that is output continuously by the RF power source to the load. In the continuous wave approach, the RF signal assumes a sinusoidal output, and the amplitude and/or frequency of the sinusoidal wave can be varied in order to vary the output power applied to the load.

A second approach to applying the RF signal to the load involves pulsing the RF signal, rather than applying a continuous wave signal to the load. In a pulse mode of operation, a RF sinusoidal signal is modulated by a modulation signal in order to define an envelope for the modulated sinusoidal signal. In a conventional pulse modulation scheme, the RF sinusoidal signal typically is output at a constant frequency and amplitude. Power delivered to the load is varied by varying the modulation signal, rather than varying the sinusoidal, RF signal.

In a typical RF power supply configuration, output power applied to the load is determined by using sensors that measure the forward and reflected power or the voltage and current of the RF signal applied to the load. Either set of these signals is analyzed in a control loop. The analysis typically determines a power value which is used to adjust the output of the RF power supply in order to vary the power applied to the load. In a RF power delivery system, where the load is a plasma chamber or other non-linear load, the varying impedance of the load causes a corresponding varying of power applied to the load, as applied power is in part a function of the impedance of the load.

In plasma systems, power is typically delivered in one of two configurations. In a first configuration, the power is capacitively coupled to the plasma chamber. Such systems are referred to as capacitively coupled plasma (CCP) systems. In a second configuration, the power is inductively coupled to the plasma chamber. Such systems are typically referred to as inductively coupled plasma (ICP) systems. Plasma delivery systems typically include a bias power and a source power applied to one or a plurality of electrodes. The source power typically generates the plasma and controls plasma density, and the bias power modulates ions in the formulation of the sheath. The bias and the source may share the same electrode or may use separate electrodes, in accordance with various design considerations.

When a RF power delivery system drives a load in the form of a non-linear load, such as a plasma chamber, the RF power absorbed by the plasma sheath results in a density of ions with a range of ion energy. One characteristic measure of ion energy is the ion energy distribution function (IEDF). The ion energy distribution function (IEDF) can be controlled with the bias RF waveform. One way of controlling the IEDF for a system in which multiple RF power signals are applied to the load occurs by varying multiple RF signals that are related by frequency and phase. The frequencies between the multiple RF power signals may be locked, and the relative phase between the multiple RF signals may also be locked. Examples of such systems can be found with reference to U.S. Pat. Nos. 7,602,127, 8,110,991, and 8,395,322, all assigned to the assignee of the present invention and incorporated by reference in this application.

RF plasma processing systems may also include components for plasma generation and control. One such component is a non-linear load, such as a plasma chamber or reactor. A typical plasma chamber or reactor utilized in RF plasma processing systems, such as by way of example, for thin-film manufacturing, can utilize a dual frequency system. One frequency (the source) of the dual frequency system controls the generation of the plasma, and the other frequency (the bias) of the dual frequency system controls ion energy. Examples of dual frequency systems include systems that are described in U.S. Pat. Nos. 7,602,127; 8,110,991; and 8,395,322, referenced above. The dual frequency system described in the above-referenced patents requires a closed-loop control system to adapt RF power supply operation for the purpose of controlling ion density and its corresponding ion energy distribution function (IEDF).

Multiple approaches exist for controlling a plasma chamber for generating plasmas. For example, phase and frequency of the driving RF signals may be used to control plasma generation. For RF driven plasma sources, the periodic waveform affecting plasma sheath dynamics and the corresponding ion energy are generally known and are controlled by the frequency of the periodic waveforms and the associated phase interaction. Another approach involves dual frequency control. That is, two RF frequency sources are used to power a plasma chamber to provide substantially independent control of ion and electron densities.

Another approach utilizes wideband RF power sources to drive a plasma chamber. A wideband approach presents certain challenges. One challenge is coupling the power to the electrode. A second challenge is that the transfer function of the generated waveform to the actual sheath voltage for a desired IEDF must be formulated for a wide-process space to support material surface interaction. In one responsive approach in an inductively coupled plasma system, controlling power applied to a source electrode controls the plasma density while controlling power applied to the bias electrode modulates ions to control the IEDF to provide etch rate control. By using source electrode and bias electrode control, the etch rate is controlled via the ion density and energy.

As integrated device fabrication continues to evolve, so do the power requirements for controlling the plasma for device fabric fabrication. For example, for memory device fabrication, the requirements for RF bias power continue to increase. Increased power generates higher energetic ions for faster surface interaction, thereby increasing the etch rate. Increased bias power is sometimes accompanied by a lower bias frequency requirement along with an increase in the number of RF bias sources coupled to the plasma sheath created in the plasma chamber. The increased power at a lower bias frequency and the increased number of RF bias sources results in intermodulation distortion (IMD) emissions from a sheath modulation. The IMD emissions can significantly reduce RF power delivered by the source where plasma generation occurs. U.S. patent application Ser. No. 13/834,786 describes a method of pulse synchronization by monitoring power in another frequency band. In the referenced U.S. patent application, the pulsing of a second RF generator is controlled in accordance with detecting at the second RF generator the pulsing of a first RF generator, thereby synchronizing pulsing between the two RF generators.

While the above systems enable a certain degree of control of a plasma process, the continually growing need for higher bias power and lower bias frequencies demand continual improvement over the above-described approaches.

FIG. 1 depicts an exemplary representation of an inductively coupled plasma (ICP) system 10. ICP system 10 includes a non-linear load, such as a plasma chamber 12, which will be referred to interchangeably herein, for generating plasma 14. Power in the form of voltage or current is applied to plasma chamber 12 via a pair of coils, including a coil assembly that in various embodiments includes an inner coil 16 and an outer coil 18. Power is applied to inner coil 16 via a RF generator or power source 20, and power is applied to outer coil 18 via a RF generator or power source 22. Coils 16 and 18 are mounted to dielectric window 24 that assists in coupling power to plasma chamber 12. A substrate 26 is placed in plasma chamber 12 and typically forms the work piece that is the subject of plasma operations. A RF generator, power supply or power source 28 (the terms may be used herein interchangeably) applies power to plasma chamber 12 via substrate 26. In various configurations, the RF power sources 20, 22 provide a source voltage or current to ignite or generate plasma 14 or control the plasma density. Also in various configurations, RF power source 28 provides a bias voltage or current that modulates the ions to control the ion energy or ion density of the plasma 14. In various embodiments, RF sources 20, 22 are locked to operate at the same frequency, voltage, and current, with fixed or varying relative phases. In various other embodiments, RF sources 20, 22 may operate at different frequencies, voltages, and currents, and relative phases.

Figure 2:
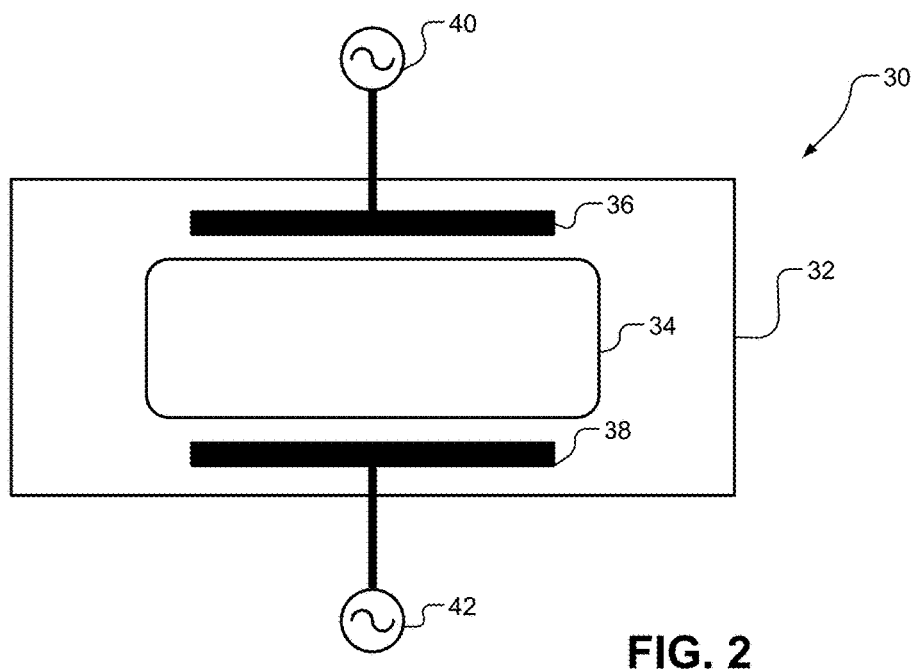
FIG. 2 depicts a representation of a capacitively coupled plasma system.

FIG. 2 depicts an exemplary representation of a capacitively coupled plasma (CCP) system 30. CCP system 30 includes a plasma chamber 32 for generating plasma 34. A pair of electrodes 36, 38 placed within plasma chamber 32 connect to respective RF generators or power sources 40, 42. In various embodiments, RF power source 40 provides a source voltage or current to ignite or generate plasma 34 or control the plasma density. Also in various embodiments, RF power source 42 provides a bias voltage or current that modulates the ions in the plasma to control the ion energy and/or ion density of the plasma 34. In various embodiments, power sources 40, 42 operate at relative phases when the RF sources are harmonically related. In various other embodiments, power sources 40, 42 operate at different frequencies, voltages, and currents, with fixed or varying relative phases. Also in various embodiments, power sources 40, 42 can be connected to the same electrode, while the counter electrode is connected to ground or to yet a third RF generator.

Figure 3:
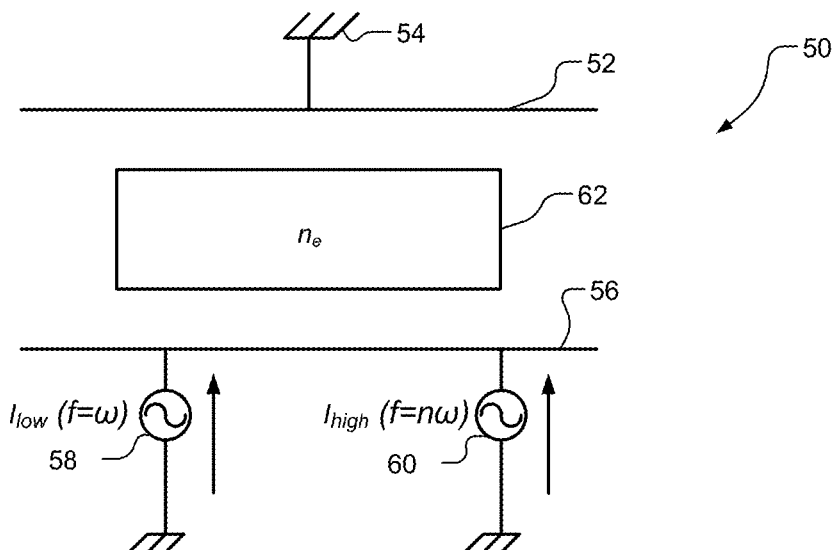
FIG. 3 depicts a generalized representation of a plasma system arranged according to various embodiments of the present disclosure.

FIG. 3 depicts a generalized representation of a dual frequency plasma system 50 and will be used to describe general operation of the RF power system of the present disclosure. Plasma system 50 includes a first electrode 52 connected to a ground 54 and a second electrode 56 spaced apart from first electrode 52. A low frequency, first RF power source 58 generates a first RF power applied to second electrode 56 at a first frequency f. A high-frequency, second power source 60 generates a second RF power applied to second electrode 56. In various embodiments, power source 60 operates at a second frequency nω that is the $n^{th}$ harmonic frequency of the frequency of first power source 58. In various other embodiments, power source 60 operates at a frequency that is not a multiple of the frequency of the first power source 58.

Driving an electrode at multiple harmonics provides the opportunity to control DC self-bias electrically and to tailor the energetic levels of ion density. The equations that govern the sheath dynamics and plasma generation must be considered when formulating a suitable solution for cancelling or reducing the power spectrum of IMD components. In doing so, it is desirable to avoid altering the sheath dynamics with a solution to alleviate IMD impairment. It is also important that plasma generation caused by the higher RF power supply does not create a power or function to affect the plasma generation. Both ion and plasma generation are controlling elements for surface removal, and any effect on the plasma parameters will adversely affect process conditions, such as etch rate or selectivity.

Application of the respective first and second powers to second electrode 56 generates plasma 62 having an electron density $n_e$. Within the plasma 62 is a sheath layer which has a greater density of positive ions, and, thus, an overall excess positive charge that balances an opposite negative charge on the surface of a material (not shown) within the plasma with which it is in contact. Determining the position of the sheath is relevant to the plasma processing operation. The sheath thickness as a function of time is shown in equation (1):

$$s(t)=s_1(1-\sin(\omega t+\phi)) \quad (1)$$

where:
$\omega=2\pi f$ is the lower frequency f of the dual frequency system; and
$\phi$ is the relative phase between the frequencies.
The term $s_n$ is the amplitude of the sheath oscillation and is defined in equation (2):

$$s_n = \frac{I_n}{e\eta_e\omega_n A}\sqrt{n} \quad (2)$$

where:
$I_n$ is the drive current associated with $\omega_n$;
$n_e$ is the electron density;
A is the electrode discharge area; and
e is electron charge.
Equations (1) and (2) demonstrate that the thickness of the sheath varies in accordance with the relative phase between $\phi$, in the case of equation (1), and the applied power, $I_n$ in the case of equation (2). In terms of the IEDF, the applied power $I_n$ is sometimes referred to as the relative amplitude variable or width, and the relative phase $\phi$ is sometimes referred to as the relative phase variable or skew.

A useful property characterizing the sheath can be found with respect to the time dependent sheath voltage described below with respect to equation (3):

$$V_{bias}(t) = \frac{en_e}{2\varepsilon_o}s^2(t) \quad (3)$$

where:
$\varepsilon_0$ is the electron charge permittivity of free space, and
e, $n_e$, and $s^2(t)$ are as described above.

Figure 4:
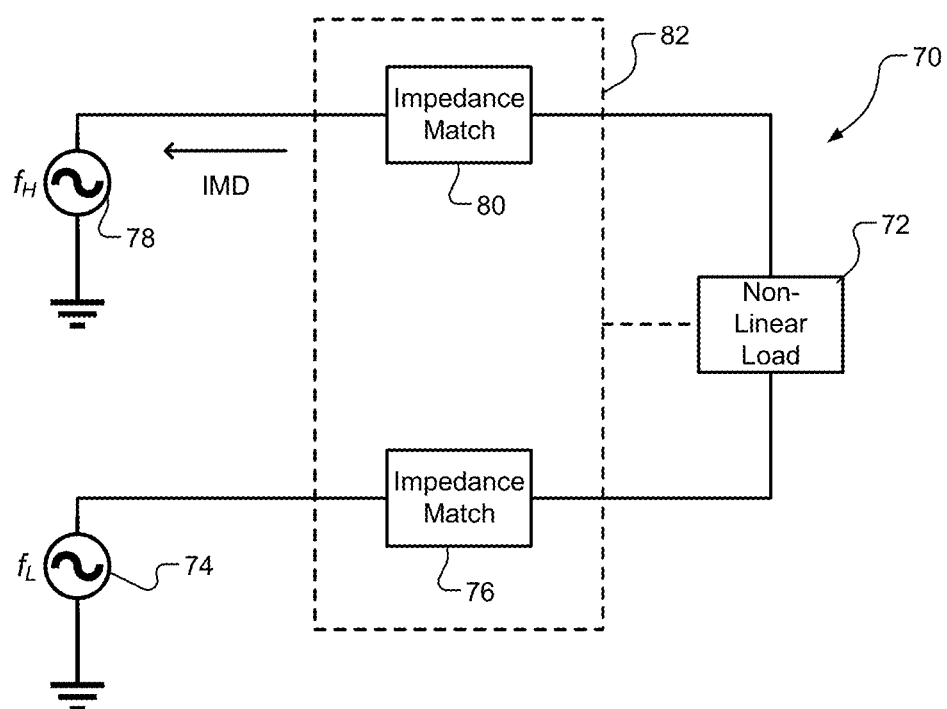
FIG. 4 is a schematic block diagram of a plasma system driven by a pair of RF generators and indicating IMD returned to one of the RF generators.

FIG. 4 depicts a schematic block diagram of a simplified plasma generation system 70. Plasma generation system 70 includes a non-linear load 72, such as a plasma chamber, having electrodes (not shown) driven by a first RF generator 74 via a match or matching network 76. Non-linear load 72 is also driven by a second RF generator 78 via a match or matching network 80. As shown in FIG. 4, RF generator 74 is configured as a low frequency RF generator, such as for a bias RF generator. RF generator 78 is configured as a high frequency RF generator, such as for RF generator 78. When operating non-linear load 72 at two different frequencies, IMD can be introduced at RF generator 78 via the transmission line between RF generator 78 and non-linear load 72.

In various embodiments, match networks 76, 80 may be combined into a single match network 82, rather than being configured as separate, individual match networks. When match networks 76, 80 are combined into a single match network 82, the output from the single match network 82

(shown in a dotted line) is input to non-linear load 72. In such a configuration, both RF generators 74, 78 drive the same electrode of non-linear load 72. In various embodiments, the other electrode of non-linear load 72 may be connected to a ground.

Figure 5:
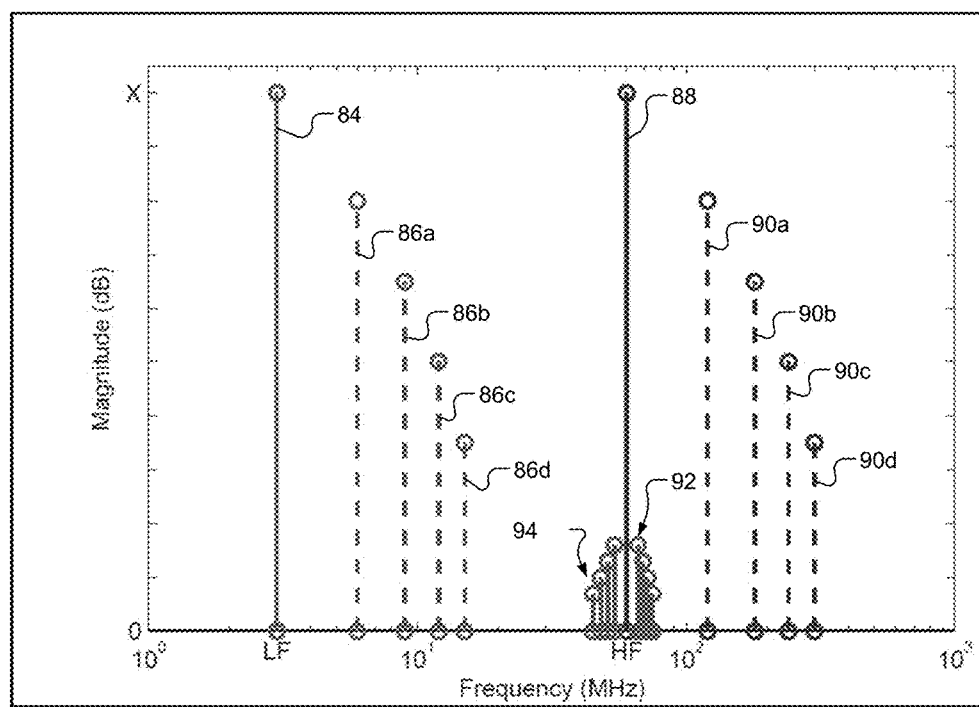
FIG. 5 is a plot of frequency versus magnitude showing waveforms for a pair of RF generators and the IMD created between the RF generators.

FIG. 5 depicts a representation of the frequencies output by RF generator 74 and RF generator 78, showing the magnitude of the power in the frequency domain. FIG. 5 includes a low frequency component 84, as may be output by RF generator 74. The low frequency component represents the 0th harmonic of the RF power output by RF generator 74. Harmonics of the output power 84 for RF generator 74 are shown at 86a, 86b, 86c, and 86d. In various embodiments, 86a, 86b, 86c, and 86d can represent the first, second, third, and fourth harmonics, or in various embodiments can represent a set of even harmonics, a set of odd harmonics, or some other mixed set of harmonics. FIG. 5 also includes a high frequency component 88 of the RF power output by RF generator 78. In various embodiments, component 88 represents the 0th order harmonic of the RF power output by RF generator 78. FIG. 5 also depicts a set of harmonics 90a, 90b, 90c, and 90d of component 88. In various embodiments, harmonics 90 may represent respective first, second, third, and fourth harmonics, a set of even harmonics, a set of odd harmonics, or some other mixed set of harmonics. FIG. 5 also depicts a first set of IMD components 92 shown on a high frequency side of component 88 and a second set of IMD components 94 shown on a low frequency side of component 88.

Returning to equation (3), it should be noted that squaring of the RF bias power produces the set of harmonics 86, 90. Notably, the bias voltage equation (3) includes a plasma density term $n_e$. The RF power spectrum from the sheath mixing produces a set of emissions seen as harmonics 86, 90 of FIG. 5. The sheath mixing also produces IMD components 92, 94 of FIG. 5. The IMD components spectrally surround high frequency component 88. The IMD components are emitted from the sheath and are coupled to the RF generator, such as RF generator 78. The IMD components coupled to the RF generator can cause stress on RF generator 78. As the plasma fabrication industry has lowered bias frequency and increased bias power, the effects of IMD have intensified.

From the foregoing it can be seen that the sheath voltage is a function of the driven frequencies and the power absorbed by the sheath. Further, it can be seen that the ion voltage is directly influenced by the sheath voltage. Thus, one approach to reducing IMD impairment is to generate an inverse, cancelling power that does not affect either the generation of the sheath voltage or plasma generation. This disclosure will describe the approach to producing power IMD components to cancel the IMD components without altering the plasma and/or the sheath.

A particular emission of the order $k^{th}$ can be described as shown below with respect to equation (4):

$$X(t)=\alpha_{HF}\alpha_{LF}\sin((\omega_{HF}+k\omega_{LF})t+\phi_{HF}+k\phi_{LF}) \quad (4)$$

where:
$\alpha_{HF}$, $\alpha_{LF}$ are representative of the magnitude of the power for the respective high frequency and low frequency generators;
$\omega_{HF}$, $\omega_{LF}$ are the center, operating frequencies of the respective high frequency and low frequency RF generators;
$\phi_{HF}$, $\phi_{LF}$ are the respective phases of the high frequency and low frequency RF generators; and
k is a constant.

If the source RF generator affected by the IMD power spectrum produces a degree of power at a set of IMD components, a transmission line cancellation is possible. The signal produced by the RF power supply may be described as follows with respect to equation (5):

$$\varphi(t)=\psi^G \sin((\omega_{HF}+k\omega_{LF})t+\phi^G) \quad (5)$$

where:
$\varphi(t)$ is the output signal from the source RF generator
$\psi^G$ is the power of the IMD cancellation signal;
$\phi^G$ is the phase of the IMD cancellation signal; and
$\omega_{HF}$, $\omega_{LF}$ are as described above.

From equation (5), it can be seen that $\varphi(t)$ is produced by the source RF generator and parameterized by $\psi^G$ and $\phi^G$ to subvert the disturbance and the interference produced by the IMD X(t).

Figure 6:
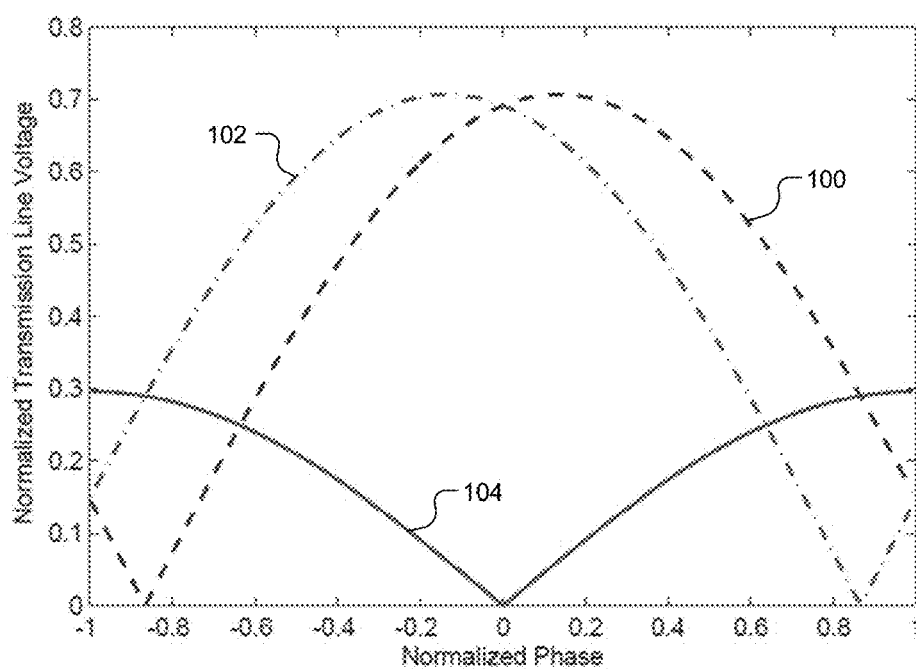
FIG. 6 is a plot of normalized phase versus normalized transmission line voltage for a first set of RF waveforms.
Figure 7:
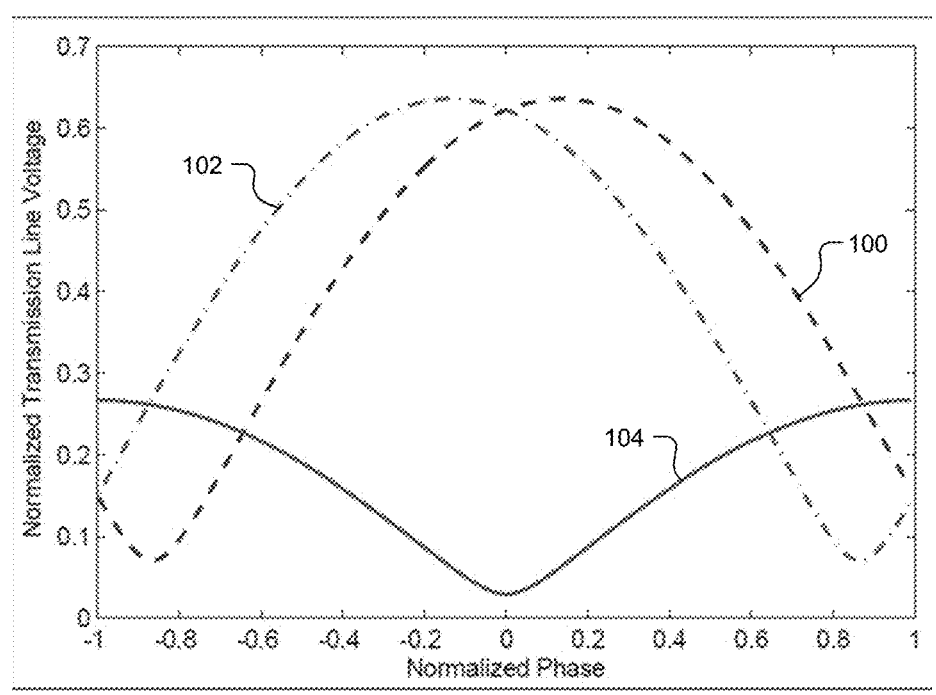
FIG. 7 depicts a plot of normalized phase vs. normalized transmission line voltage for a second set of RF waveforms.

FIGS. 6 and 7 depict a pair of waveforms that result in the cancellation of IMD by phase control of $\phi^G$. FIGS. 6 and 7 each show a first node voltage 100 representing the IMD emission, and a second node voltage 102 representing the power produced by a RF generator to which the IMD emission is detected, such as RF generator 78, to cancel the IMD. As shown in FIG. 6, at zero degrees normalized phase, the power across the transmission line is cancelled, as shown by node voltage 104. In FIG. 7, the magnitude of the IMD 100 and source second node voltage 102 are not of equal power, and the IMD at zero degrees normalized phase can be squelched without a further increase in power, as shown at node voltage 104. Of particular note, power is cancelled across the transmission line, not from the RF generator 78, and no power delivered from the RF generator is greater than the IMD power. This avoids interfering with the plasma parameters of ion and electron density and the corresponding influence on process conditions.

In various embodiments, total IMD rejection is not necessary. In various embodiments, it is only desirable to reduce IMD interference to a level that does not adversely stress the RF power delivery system and compromise reliability. In various embodiments, a control system locks to an IMD spur, or set of spurs, but not necessarily all IMD spurs. Power is then adjusted via parameterized actuators described with respect to equation (5) to control a sufficient response to degrade the IMD power spectrum.

Figure 8:
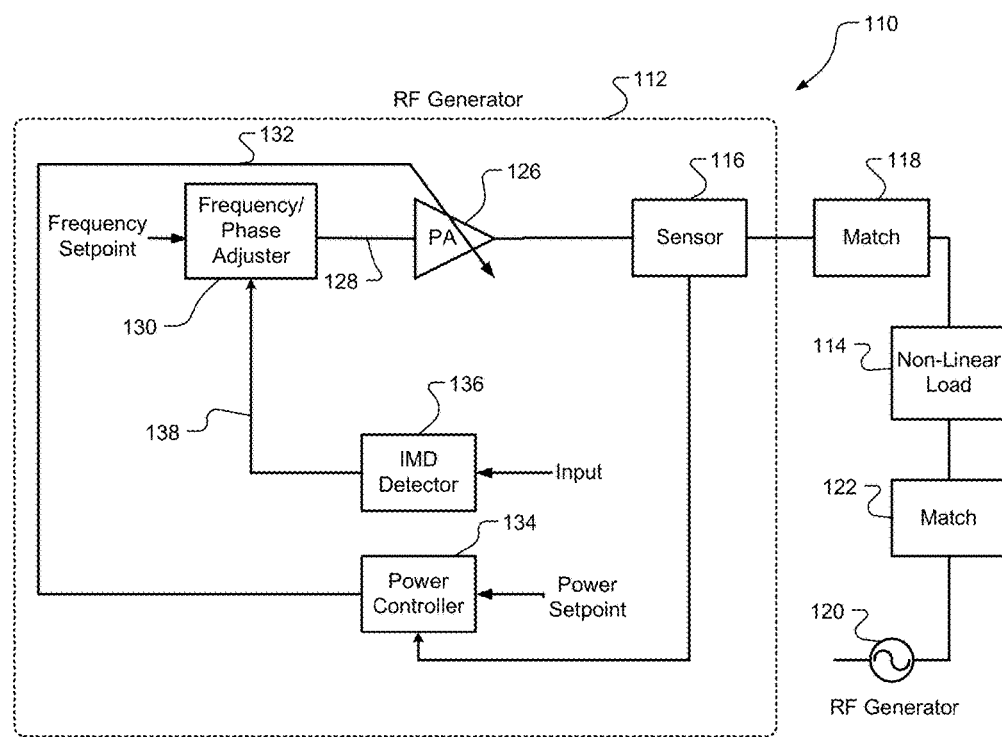
FIG. 8 is a schematic block diagram of an IMD countermeasure system arranged in accordance with the present disclosure.

FIG. 8 depicts a generalized schematic block diagram of an adaptive counter measure control thwarting and jamming impairment system 110. System 110 includes a first RF generator 112 generating an RF signal applied to a non-linear load, such as a plasma chamber, via a sensor 116 and a match or matching network 118. A second RF generator 120 generates a second RF signal to non-linear load 114 via a match or matching network 122.

RF generator 112 includes a power amplifier 126 generating the RF signal to sensor 116. Power amplifier 126 receives a control signal 128. In various embodiments, control signal 128 is a frequency signal to cause power amplifier 126 to generate the RF signal applied to non-linear load 114 at a predetermined frequency. Frequency is set via a frequency setpoint applied to a frequency/phase adjuster module 130, as will be described in greater detail herein. The power output by power amplifier 126 can be controlled via a power control signal 132 generated by power controller 134. Power controller 134 receives a power setpoint value and generates power control signal 132 applied to power amplifier 126.

In various embodiments, RF generator 112 also includes an IMD detector 136. IMD detector 136 receives an input signal, as will be described in greater detail herein, determines the intermodulation distortion (IMD) generated by the interaction between RF generator 112 and RF generator 120, and generates an IMD signal 138 applied to frequency/phase adjuster module 130. Frequency/phase adjuster module 130 adjusts the frequency and phase of power amplifier 126 in accordance with IMD signal 138 and a frequency setpoint. In various embodiments, IMD detector 136 outputs frequencies in which IMD components exist and the IMD generated through the interaction of RF signals from respective RF generators 112, 120.

In various embodiments, the input signal applied to IMD detector 136 can take various forms. In various embodiments, input to IMD detector 136 may be a processed signal received from sensor 116. IMD detector 136 can detect a frequency locked to the IMD frequency that is one of the harmonics of RF generator 120. In various embodiments, frequency locking can be achieved using a phase detector found in a digital common exciter core of RF generator 112, such as is described with reference to U.S. Pat. No. 7,602,127, assigned to the assignee of the present application, to phase lock loop to the frequency of RF generator 120. In various other embodiments, IMD detector 136 can phase lock to the RF frequency output by RF generator 112 and RF generator 120 formulating the IMD power spectrum. In such a configuration, a control system is integrated into the RF generator 112 and may operate independently of any common excitation. In various other embodiments, input to IMD detector 136 can be implemented via an input signal from RF generator 120 allowing IMD detector 136 to phase lock to the RF frequency of RF generator 120 in order to determine IMD signal 138. In various embodiments, a phase lock loop can be replaced with time referenced signals generated by a time reference module.

In various embodiments, RF generator 112 is a source RF generator, typically operating at relatively high frequencies, and RF generator 120 is a bias RF generator, typically operating at lower frequencies. Thus, in various embodiments, RF generator 112 determines a plasma density in a plasma chamber implemented in non-linear load 114, and RF generator 120 modulates ions in a plasma chamber implemented as non-linear load 114.

Figure 9:
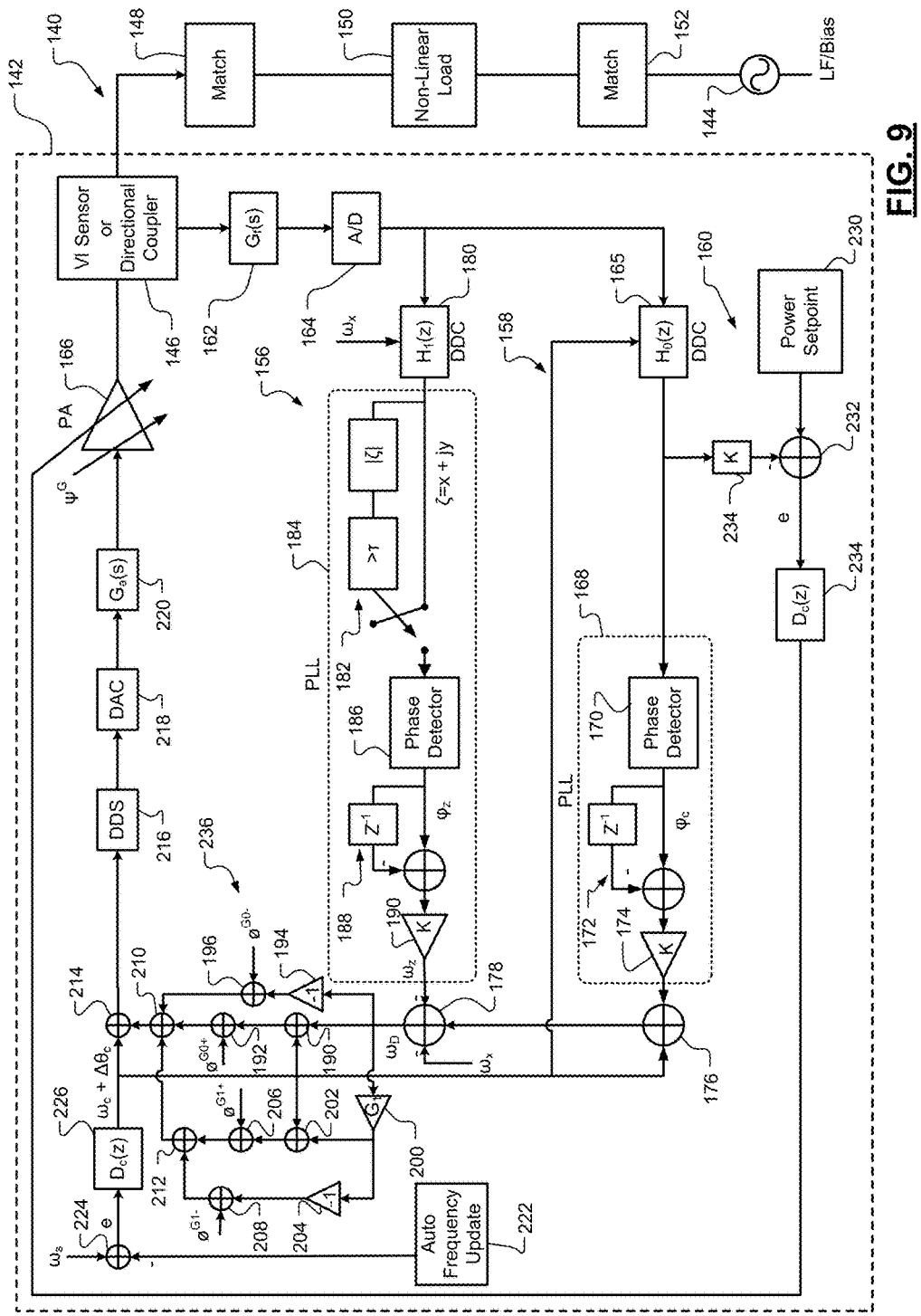
FIG. 9 is a detailed block diagram of an IMD countermeasure system arranged in accordance with the present disclosure.

FIG. 9 depicts a schematic block diagram of an adaptive counter measure control thwarting IMD jamming impairments for a RF plasma system 140 arranged in accordance with various embodiments. The system 140 includes a first RF generator 142, generally referred to as a high frequency or source RF generator and a second RF generator 144, generally referred to as a low frequency or bias RF generator. Source RF generator 142 generates an RF signal applied to a sensor 146, which in various embodiments may be a voltage/current sensor (VI sensor) or directional coupler. The RF signal passing through sensor 146 is applied to match or matching network 148 and then to a non-linear load 150, which may be embodied as a plasma chamber. Bias RF generator 144 generates an RF signal applied to match or matching network 152 and then to non-linear load 150. In addition to the typical components of a plasma control system, such as bias RF generator 144 and source RF generator 142, matching networks 148, 152, the adaptive counter measure system 140 includes IMD correction at the source RF generator 142. As shown in FIG. 9, source RF generator 142 includes an IMD detector 156, an operating frequency detector 158, and a power adjustment section 160.

The operating frequency detector 158 of RF generator 142 receives an input signal representative of a pair of signals output from sensor 146. The output from sensor 146 passes through a transfer function GF(s) which applies a filtering function with a bandwidth limiting the system spectrum to the IMD spectrum. The output from transfer function 162 is applied to analog-to-digital (A/D) converter 164. The output from A/D converter 164 is applied to digital decimator (DDC) 165 of operating frequency detector 158.

The operating frequency detector 158 of the RF generator 142 includes a transfer function $H_0(z)$, which is implemented as a digital decimator 165. Transfer function $H_0(z)$ also receives the commanded operating frequency ($\omega_c+\Delta\theta_c$) for RF power amplifier 166. The output of the DDC 165 is input to a phase lock loop 168. Phase lock loop 168 includes a phase detector 170, an accumulator 172 to accumulate the detected phase, and a gain 174. The output from PLL 168 is input to summer 176 which compares the measured operating frequency output by PLL 168 with the commanded operating frequency ($\omega_c+\Delta\theta_c$). The output of summer 174 is input to summer 178, which will be described in connection with IMD detector 156.

IMD is determined by applying the output of the A/D converter 164 to the DDC 180, which implements a transfer function $H_1(z)$. DDC 180 also receives a frequency signal $\omega_x$, which represents the operating frequency of bias generator 144. Frequency signal $\omega_x$ can be swept in based on the harmonics of the operating frequency of the bias generator 144 in order to detect IMD components. The output from transfer function $H_1(z)$ 180 includes IMD components introduced at the output of bias RF generator 144 and is represented as the imaginary quantity $\zeta=x+jy$. The quantity $\zeta$ is input to a switch 182 of a phase lock loop 184. If the magnitude of $\zeta$ of the IMD is less than a predetermined quantity, $\tau$, the output of transfer function $H_1(z)$ 180 does not connect to phase detector 186 of the phase lock loop 184 so that the input to phase detector 186 remains open. If the magnitude of $\zeta$ of the IMD is greater than $\tau$, the output of switch 182 connects to phase detector 186. Phase detector 186 connects to the accumulator 188 and gain 190. The output from phase lock loop 184, $\omega_z$, is input to summer 178. Summer 178 also receives the error signal from summer 176 described above, and $\omega_x$, also described above. Summer 178 outputs a frequency $\omega_D$, which represents the frequency of the IMD, to phase adjustment module or section 236.

In phase adjustment section 236, the frequency $\omega_D$ represents the 0th order harmonic of the IMD. In the frequency $\omega_D$ is used to determine correction for the $i^{th}$ and $k^{th}$ orders of IMD. The example described in this disclosure IMD is determined for the 0th and $1^{st}$ order of IMD.

For the 0th order IMD correction, the frequency $\omega_D$ is input to summer 190 and added to the commanded operating frequency ($\omega_c+\Delta\theta_c$). The output of the summation of the frequencies $\omega_D$ and ($\omega_c+\Delta\theta_c$) is input to summer 192, which also receives a phase of the IMD $\phi^{G_0^+}$, which represents the phase for cancellation of the $0^{th}$ order IMD on the positive side of the commanded frequency ($\omega_c+\Delta\theta_c$). Summer 196 also receives a phase for cancellation of the $0^{th}$ order IMD on the negative side of the operating frequency ($\omega_c+\Delta\theta_c$). The IMD on the negative side of the frequency ($\omega_c+\Delta\theta_c$) is generated by inverting $\omega_D$ at gain 194 and adding inverted $\omega_D$ to a phase of the IMD $\phi^{G_0^+}$ at summer 196. The output from summer 192, 196 is input to summer 210.

A similar correction occurs for the 1st order harmonic of the IMD. The $0^{th}$ order harmonic is multiplied by a gain $G_1$ at 200 and input to summer 202 and inverter 204. Summer 202 operates similarly to summer 190, but operates on the $1^{st}$ order harmonic rather than the $0^{th}$ order harmonic. Output from summer 202 is applied to summer 206, which operates similarly to summer 192, but adds a phase of the IMD $\phi^{G_1^+}$ to determine a phase for the $0^{th}$ harmonic on the positive side of the commanded frequency ($\omega_c+\Delta\theta_c$). The output from inverter 204 is input to summer 208, which operates similarly to summer 192, but on the negative side of the commanded frequency ($\omega_c+\Delta\theta_c$) for the first harmonic.

The cancellation components of the 0th order harmonic on the positive and negative side of the commanded operating frequency are added at summer 210. The output of summers 206 and 208 are added at summer 212 for the first harmonic and provide the phase correction for both the positive and negative side of the IMD for the $1^{st}$ harmonic of the IMD. The output for summer 212 is also added to summer 210, along with the output of summer 192 and summer 196. The output from summer 210 provides a phase correction to the commanded operating frequency ($\omega_c+\Delta\theta_c$) and is added at summer 214.

A phase adjusted signal is output from summer 214 and applied to direct digital synthesizer (DDS) 216. The output from DDS 216 is applied to digital-analog-converter (DAC) 218. The output from DAC 218 is input to transfer function $G_a(s)$. The analog signal output by DAC 218 and input to transfer function $G_a(s)$ 220 is then applied to power amplifier 166 to generate a phase-adjusted signal output by power amplifier 166 to cancel the IMD products returned towards power amplifier 166 from non-linear load 150.

In various embodiments, system 140 also includes a power adjustment section 160 which provides for power correction based on a power setpoint. Power setpoint 230, which is a predetermined value, is input to summer 232. Summer 232 also provides a scaled version of the signal output by DDC 165. The input to summer 232 is scaled from a raw sensor quantity to a calibrated value at 234 to provide a power value. Summer 232 outputs an error signal e, which indicates an error in the measured power relative to the power setpoint. The error signal is scaled by the digital controller transfer function $D_c(z)$ at 234 and applied to power amplifier 166 to vary the amplitude of the signal output by power amplifier 166.

In addition to a power signal provided by power adjustment section, power amplifier 166 can be controlled to reduce IMD with a supplemental power control signal $\psi^G$, described above in connection equation (5) above. Power amplifier 166 is shown receiving power adjustment value $\psi^G$. In various embodiments, $\psi^G$ may be determined based on equations (1) and (2) below:

$$\begin{bmatrix} \psi_{n+1}^{Gi} \\ \phi_{n+1}^{Gi^+} \\ \phi_{n+1}^{Gi^-} \end{bmatrix} = \begin{bmatrix} \psi_n^{Gi} & \lambda_\psi^{Gi}\alpha_\psi^{Gi} & \lambda_\psi^{Gi}\beta_\psi^{Gi} \\ \phi_n^{Gi^+} & \lambda_\phi^{Gi^+}\alpha_\phi^{Gi^+} & \lambda_\phi^{Gi^+}\beta_\phi^{Gi^+} \\ \phi_n^{Gi^-} & \lambda_\phi^{Gi^-}\alpha_\phi^{Gi^-} & \lambda_\phi^{Gi^-}\beta_\phi^{Gi^-} \end{bmatrix} \begin{bmatrix} 1 \\ \zeta_n^{Gi} \\ \zeta_{n-1}^{Gi} \end{bmatrix} \forall i \quad (6)$$

and $$\zeta = T_{set} - T_{actual} \quad (7)$$

where:
$\psi^{Gi}$ is an amplitude of the power for an $i^{th}$ IMD product;
$\phi^{Gi^+}$, $\phi^{Gi^-}$ is a phase of a signal for reducing a positive, negative side $i^{th}$ IMD product;
$\lambda_\psi^{Gi}$ is a gain IMD correction coefficient for the $i^{th}$ IMD product for adjusting power;
$\alpha_\psi^{Gi}$ is a first IMD correction coefficient for the $i^{th}$ IMD product for adjusting power;
$\beta_\psi^{Gi}$ is a second IMD correction coefficient for the $i^{th}$ IMD product for adjusting power;

$\lambda_\phi^{Gi^+}$, $\lambda_\phi^{Gi^-}$ is an IMD gain correction coefficient for the positive, negative side $i^{th}$ IMD product for adjusting phase;
$\alpha_\phi^{Gi^+}$, $\alpha_\phi^{Gi^-}$ is a first IMD correction coefficient for the positive, negative side $i^{th}$ IMD product for adjusting phase;
$\beta_\phi^{Gi^+}$, $\beta_\phi^{Gi^-}$ is a second IMD correction coefficient for the positive, negative side $i^{th}$ IMD product for adjusting phase;
$T_{set}$ is a requested power; and
$T_{actual}$ is a measured power.

In some configurations, the magnitude of the IMD cancellation components of RF generator 142 is selected so as to not completely cancel the IMD. This allows for detection of IMD which would otherwise not be possible if the IMD components returned to RF generator 142 are completely cancelled.

The commanded frequency ($\omega_c+\Delta\theta_c$) is determined based upon a commanded source frequency $\omega_s$ and an auto frequency update 222. The commanded frequency $\omega_s$ and the auto frequency update 222 are input to summer 224 where the auto frequency update 222 is added to the source frequency $\omega_s$ as shown. The output from summer 224 is an error signal e input to transfer function $D_c(z)$ (226) which generates the commanded output frequency ($\omega_c+\Delta\theta_c$).

Figure 10:
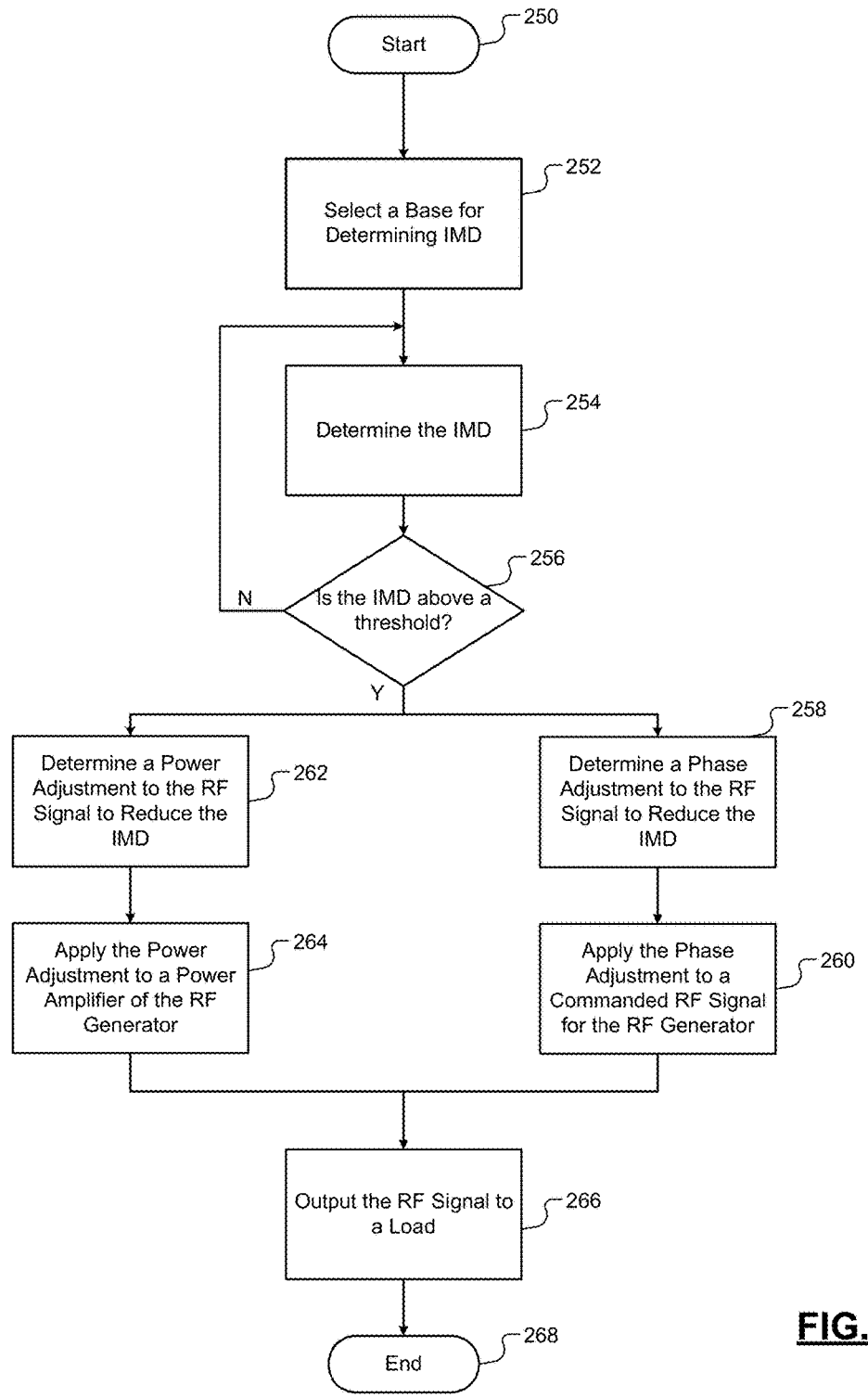
FIG. 10 is a flowchart describing a method for reducing IMD.

With reference to FIG. 10, a method for canceling IMD will be described. Control begins at start block 250 and proceeds to block 252. At 252, a base for determining the IMD is selected. The base for determining IMD can take various forms, as described above. For example, frequency locking can be achieved using a phase detector found in a digital common exciter core of the source RF generator. Alternatively, an IMD detector can phase lock onto the RF frequency output by the source RF generator and bias RF generator formulating the IMD power spectrum. In various other configurations, an input signal from a bias RF generator can allow the phase detector to lock to the RF frequency of the bias RF generator. Further, in various configurations, a phase lock loop can be replaced with time referenced signals generated by a time referenced module. The base may be flexibly implemented or may be limited to a particular approach.

Once a base is selected at 252, control proceeds to block 254. A block 254, the IMD is determined, as described above. The IMD is output to block 256. At block 256, a test is performed to determine if the IMD is above a predetermined threshold. If the IMD is below a predetermined threshold, no IMD reduction occurs, and control returns to block 256. If the IMD is above a predetermined threshold, control proceeds to one or both of blocks 258 or 262. At block 258, a phase adjustment for the RF signal is determined in order to reduce the IMD. Control proceeds to block 260 where the phase adjustment is applied to a commanded RF signal for the RF generator in order to output an RF signal which cancels IMD under the transmission line between the RF generator and the load. Once a phase adjustment is applied to a commanded RF signal for the RF generator, control proceeds to block 266. A block 266, the power amplifier of the RF generator outputs the RF signal to the load.

In various embodiments, in addition to phase adjustment, power adjustment can also be made in order to reduce the IMD. In various optional configurations, blocks 262 and 264 implement a power-based IMD reduction. At block 262, a power adjustment to the RF signal in order to reduce the IMD is determined. Once the power adjustment to the RF signal is determined, control proceeds to block 264. At block

264, the power adjustment is applied to a power amplifier of the RF generator. The amplitude of the power amplifier is thus adjusted in order to assist with reducing the IMD. Control proceeds to block 266 in which the output of the RF signal is applied to a load. Control then proceeds to block 268 where the process is completed.

The system described above provides several advantages according to various embodiments, although the advantages described herein are exemplary and not limiting to the scope of the disclosure. The system described herein significantly reduces IMD introduced by low-frequency bias generators into high-frequency source generators. The system enables operation of low-frequency, bias generators at higher powers without imposing stress on the plasma generating RF source generators. The system reduces IMD impairment without dissipating power in the plasma or reducing delivered power to the plasma, with both fidelity and sensitivity. The system also reduces IMD effects without altering plasma ionization and disassociation rates. The system maintains fidelity of the collisionality of sheath dynamics without altering electron densities and plasma generation and also provides variability to alleviate IMD effects based on a threshold that could be configurable parameters, such as internal RF generator dissipation or the magnitude of some or all of the out-of-band sampled power spectrum. The system reduces or eliminates IMD without altering process conditions such as etch rate and selectivity. Further, the foregoing can be configured to target specific IMD orders with corresponding reduction, such as selecting highest IMDs, and the auto-tailoring control to counter measure specific IMDs. The system can also be configured to reduce multiple IMDs for greater reduction of dissipation and stress, or countering specific IMDs with a combination of phase and amplitude control. The system also supplies active control for agile frequency sources to track the source RF frequency along with bias power supplies.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. A radio frequency (RF) generator, comprising:
a power amplifier, the power amplifier generating a first RF signal applied to a non-linear load in accordance with an input control signal, the input control signal varying in accordance with a commanded operating signal;
an intermodulation distortion (IMD) module, the IMD module determining at least one IMD component in a signal reflected from the non-linear load, the at least one IMD component generated in accordance with interaction between the first RF signal and a second RF signal applied to the non-linear load from a second RF generator, the IMD module generating an IMD component signal; and
a phase adjustment module, the phase adjustment module receiving the commanded operating signal and the IMD component signal, the phase adjustment module generating an IMD adjustment signal to reduce the at least one IMD component, the phase adjustment module varying a phase between the commanded operating signal and the IMD component signal to generate the IMD adjustment signal, the phase adjustment module combining the commanded operating signal and the IMD adjustment signal to vary the input control signal.

2. The RF generator of claim 1 wherein the IMD module includes a phase lock loop wherein the phase is locked to a frequency of a harmonic of the IMD component.

3. The RF generator of claim 1 wherein the IMD module includes a phase lock loop, wherein the phase is locked to a predetermined input signal.

4. The RF generator of claim 3 wherein the predetermined input signal varies in accordance with a frequency of the second RF signal.

5. The RF generator of claim 1 wherein the at least one IMD component is a first harmonic or a negative of first harmonic of the IMD.

6. The RF generator of claim 1 wherein the at least one IMD component is an nth order harmonic of the IMD.

7. The RF generator of claim 6 wherein the at least one IMD component is a negative of the nth order harmonic of the IMD.

8. The RF generator of claim 1 wherein the at least one IMD component is a selected set of harmonics of the IMD.

9. The RF generator of claim 8 wherein the at least one IMD component is a negative of the selected set of harmonics of the IMD.

10. The RF generator of claim 1 wherein the at least one IMD component is one of a selected set of even harmonics of the IMD.

11. The RF generator of claim 10 wherein the at least one IMD component is a negative of the selected set of even harmonics of the IMD.

12. The RF generator of claim 1 wherein the at least one IMD component is one of a selected set of odd harmonics of the IMD.

13. The RF generator of claim 12 wherein the at least one IMD component is a negative of the selected set of odd harmonics of the IMD.

14. The RF generator of claim 1 further comprising a first frequency detector, the first frequency detector determining an error between a frequency of the commanded operating signal, indicating a frequency of the first RF signal, and a measured frequency of the first RF signal, and generating an error signal.

15. The RF generator of claim 1 further comprising a power adjustment module, the power adjustment module applying a power adjustment signal to the power amplifier in accordance with:

$$\begin{bmatrix} \psi_{n+1}^{G_i} \\ \phi_{n+1}^{G_i^+} \\ \phi_{n+1}^{G_i^-} \end{bmatrix} = \begin{bmatrix} \psi_n^{G_i} & \lambda_\psi^{G_i} \alpha_\psi^{G_i} & \lambda_\psi^{G_i} \beta_\psi^{G_i} \\ \phi_n^{G_i^+} & \lambda_\phi^{G_i^+} \alpha_\phi^{G_i^+} & \lambda_\phi^{G_i^+} \beta_\phi^{G_i^+} \\ \phi_n^{G_i^-} & \lambda_\phi^{G_i^-} \alpha_\phi^{G_i^-} & \lambda_\phi^{G_i^-} \beta_\phi^{G_i^-} \end{bmatrix} \begin{bmatrix} 1 \\ \zeta_n^{G_i} \\ \zeta_{n-1}^{G_i} \end{bmatrix} \forall \, i$$

and $$\zeta = T_{set} - T_{actual}$$

where:
$\psi^{G_i}$ is an amplitude of the power for an $i^{th}$ IMD product;
$\phi^{G_i^+}$, $\phi^{G_i^-}$ is a phase of a signal for reducing a positive, negative side $i^{th}$ IMD product;
$\lambda_\psi^{G_i}$ is a gain IMD correction coefficient for the $i^{th}$ IMD product for adjusting power;

$\alpha_\psi^{G_i}$ is a first IMD correction coefficient for the i$^{th}$ IMD product for adjusting power;

$\beta_\psi^{G_i}$ is a second IMD correction coefficient for the i$^{th}$ IMD product for adjusting power;

$\lambda_\phi^{G_i^+}, \lambda_\phi^{G_i^-}$ is an IMD gain correction coefficient for the positive, negative side i$^{th}$ IMD product for adjusting phase;

$\alpha_\phi^{G_i^+}, \alpha_\phi^{G_i^-}$ is a first IMD correction coefficient for the positive, negative side i$^{th}$ IMD product for adjusting phase;

$\beta_\phi^{G_i^+}, \beta_\phi^{G_i^-}$ is a second IMD correction coefficient for the positive, negative side i$^{th}$ IMD product for adjusting phase;

$T_{set}$ is a requested power; and $T_{actual}$ is a measured power.

16. The RF generator of claim 1 wherein the RF generator operates in at least one of a pulse mode of operation or a continuous wave mode of operation.

17. An apparatus for reducing IMD, comprising:
an intermodulation distortion (IMD) module configured to determine an IMD component received from a non-linear load in response to a first RF signal and a second RF signal applied to the non-linear load via respective first and second RF generators, the IMD component generated in accordance with interaction between the first RF signal and the second RF signal, the IMD module generating an IMD component signal; and a phase adjustment module configured to receive a commanded operating signal and the IMD component signal, the phase adjustment module further configured to generate an IMD adjustment signal, the phase adjustment module varying a phase between the commanded operating signal and the IMD component signal to generate the IMD adjustment signal, the phase adjustment module combining the commanded operating signal and the IMD adjustment signal to reduce the IMD component and to vary an input control signal, wherein one of the first RF signal or the second RF signal introduces the IMD component, and the input control signal is input to a power amplifier of a RF generator generating the other of the first RF signal or the second RF signal.

18. The apparatus of claim 17 wherein the IMD module includes a phase lock loop wherein the phase is locked to a frequency of a harmonic of the IMD component.

19. The apparatus of claim 17 wherein the IMD module includes a phase lock loop, wherein the phase is locked to a predetermined input signal.

20. The apparatus of claim 19 wherein the predetermined input signal varies in accordance with a frequency of the first RF signal introducing the IMD component.

21. The apparatus of claim 17 wherein the phase adjustment module reduces the IMD component of an nth order harmonic of the IMD.

22. The apparatus of claim 17 wherein the phase adjustment module reduces the IMD component of a selected set of harmonics of the IMD.

23. The apparatus of claim 22 wherein the IMD component is a negative of the selected set of harmonics of the IMD.

24. The apparatus of claim 17 further comprising a power adjustment module, the power adjustment module applying a power adjustment signal to the power amplifier in accordance with:

$$\begin{bmatrix} \psi_{n+1}^{G_i} \\ \phi_{n+1}^{G_i^+} \\ \phi_{n+1}^{G_i^-} \end{bmatrix} = \begin{bmatrix} \psi_n^{G_i} & \lambda_\psi^{G_i} \alpha_\psi^{G_i} & \lambda_\psi^{G_i} \beta_\psi^{G_i} \\ \phi_n^{G_i^+} & \lambda_\phi^{G_i^+} \alpha_\phi^{G_i^+} & \lambda_\phi^{G_i^+} \beta_\phi^{G_i^+} \\ \phi_n^{G_i^-} & \lambda_\phi^{G_i^-} \alpha_\phi^{G_i^-} & \lambda_\phi^{G_i^-} \beta_\phi^{G_i^-} \end{bmatrix} \begin{bmatrix} 1 \\ \zeta_n^{G_i} \\ \zeta_{n-1}^{G_i} \end{bmatrix} \forall i$$

and $\zeta = T_{set} - T_{actual}$ where:

$\psi^{G_i}$ is an amplitude of the power for an i$^{th}$ IMD product;

$\phi^{G_i^+}, \phi^{G_i^-}$ is a phase of a signal for reducing a positive, negative side i$^{th}$ IMD product;

$\lambda_\psi^{G_i}$ is a gain IMD correction coefficient for the i$^{th}$ IMD product for adjusting power;

$\alpha_\psi^{G_i}$ is a first IMD correction coefficient for the i$^{th}$ IMD product for adjusting power;

$\beta_\psi^{G_i}$ is a second IMD correction coefficient for the i$^{th}$ IMD product for adjusting power;

$\lambda_\phi^{G_i^+}, \lambda_\phi^{G_i^-}$ is an IMD gain correction coefficient for the positive, negative side i$^{th}$ IMD product for adjusting phase;

$\alpha_\phi^{G_i^+}, \alpha_\phi^{G_i^-}$ is a first IMD correction coefficient for the positive, negative side i$^{th}$ IMD product for adjusting phase;

$\beta_\phi^{G_i^+}, \beta_\phi^{G_i^-}$ is a second IMD correction coefficient for the positive, negative side i$^{th}$ IMD product for adjusting phase;

$T_{set}$ is a requested power; and $T_{actual}$ is a measured power.

25. The apparatus of claim 17 wherein the first RF generator and the second RF generator each operate in at least one of a pulse mode of operation or a continuous wave mode of operation.

26. A method for reducing IMD, comprising:
determining IMD reflected from a non-linear load in response to a first RF signal and a second RF signal applied to the non-linear load via a respective first RF generator and second RF generator, the IMD generated in accordance with interaction between the first RF signal and the second RF signal, and generating an IMD signal;

applying a phase adjustment between a commanded operating signal and the IMD signal and generating an IMD adjustment signal;

combining the commanded operating signal and the IMD adjustment signal to generate an input control signal to reduce the IMD; and wherein one of the first RF signal or the second RF signal output by the selected one of the first RF generator or the second RF generator introduces the IMD, and applying the input control signal to a power amplifier of the RF generator generating the other of the first RF signal or the second RF signal, wherein the commanded operating signal is associated with the other of the first RF signal or the second RF signal.

27. The method of claim 26 further comprising selecting a frequency base for determining the IMD in accordance with at least one of a frequency of a harmonic of the IMD, a frequency of an RF signal output by at least one of the first RF generator, or a time base signal.

28. The method of claim 26 further comprising applying the phase adjustment to reduce the IMD of an nth order harmonic of the IMD.

29. The method of claim 26 further comprising applying the phase adjustment to reduce the IMD of a selected set of harmonics of the IMD.

30. The method of claim 29 further comprising applying the phase adjustment to reduce the IMD of a negative of the selected set of harmonics of the IMD.

31. The method of claim 26 further comprising applying a power adjustment signal to the power amplifier in accordance with:

$$\begin{bmatrix} \psi_{n+1}^{G_i} \\ \phi_{n+1}^{G_i^+} \\ \phi_{n+1}^{G_i^-} \end{bmatrix} = \begin{bmatrix} \psi_n^{G_i} & \lambda_\psi^{G_i} \alpha_\psi^{G_i} & \lambda_\psi^{G_i} \beta_\psi^{G_i} \\ \phi_n^{G_i^+} & \lambda_\phi^{G_i^+} \alpha_\phi^{G_i^+} & \lambda_\phi^{G_i^+} \beta_\phi^{G_i^+} \\ \phi_n^{G_i^-} & \lambda_\phi^{G_i^-} \alpha_\phi^{G_i^-} & \lambda_\phi^{G_i^-} \beta_\phi^{G_i^-} \end{bmatrix} \begin{bmatrix} 1 \\ \zeta_n^{G_i} \\ \zeta_{n-1}^{G_i} \end{bmatrix} \forall i$$

and $$\zeta = T_{set} - T_{actual}$$

where:
- $\psi^{G_i}$ is an amplitude of the power for an $i^{th}$ IMD product;
- $\phi^{G_i^+}, \phi^{G_i^-}$ is a phase of a signal for reducing a positive, negative side $i^{th}$ IMD product;
- $\lambda_\psi^{G_i}$ is a gain IMD correction coefficient for the $i^{th}$ IMD product for adjusting power;
- $\alpha_\psi^{G_i}$ is a first IMD correction coefficient for the $i^{th}$ IMD product for adjusting power;
- $\beta_\psi^{G_i}$ is a second IMD correction coefficient for the $i^{th}$ IMD product for adjusting power;
- $\lambda_\phi^{G_i^+}, \lambda_\phi^{G_i^-}$ is an IMD gain correction coefficient for the positive, negative side $i^{th}$ IMD product for adjusting phase;
- $\alpha_\phi^{G_i^+}, \alpha_\phi^{G_i^-}$ is a first IMD correction coefficient for the positive, negative side $i^{th}$ IMD product for adjusting phase;
- $\beta_\phi^{G_i^+}, \beta_\phi^{G_i^-}$ is a second IMD correction coefficient for the positive, negative side $i^{th}$ IMD product for adjusting phase;
- $T_{set}$ is a requested power; and
- $T_{actual}$ is a measured power.

32. The method of claim 26 wherein the first RF generator and the second RF generator each operate in at least one of a pulse mode of operation or a continuous wave mode of operation.

33. The method of claim 26 further comprising a power adjustment module, the power adjustment module applying a power adjustment signal to the power amplifier to reduce the IMD component.

34. The RF generator of claim 1 further comprising a power adjustment module, the power adjustment module applying a power adjustment signal to the power amplifier to reduce the at least one IMD component.

35. The RF generator of claim 17 further comprising a power adjustment module, the power adjustment module applying a power adjustment signal to the power amplifier to reduce the IMD component.

* * * * *